(12) United States Patent
Okabe et al.

(10) Patent No.: US 7,971,352 B2
(45) Date of Patent: Jul. 5, 2011

(54) METHOD OF MANUFACTURING PRINTED CIRCUIT BOARD

(75) Inventors: Shuhichi Okabe, Gyunggi-do (KR); Jin-Yong An, Daejeon (KR); Seok-Kyu Lee, Suwon-si (KR); Soon-Oh Jung, Suwon-si (KR); Jong-Kuk Hong, Suwon-si (KR); Hae-Nam Seo, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 448 days.

(21) Appl. No.: 12/213,465

(22) Filed: Jun. 19, 2008

(65) Prior Publication Data

US 2009/0151160 A1 Jun. 18, 2009

(30) Foreign Application Priority Data

Dec. 13, 2007 (KR) .................. 10-2007-0129894

(51) Int. Cl.
*H01R 9/00* (2006.01)
*H05K 3/00* (2006.01)

(52) U.S. Cl. ............... 29/843; 29/830; 29/831; 29/840; 438/613; 438/614; 438/674

(58) Field of Classification Search ............. 29/843, 29/592, 620, 830–832, 840; 257/675, 676, 257/684, 796, E21.507, E21.627; 438/613–615, 438/674

See application file for complete search history.

(56) References Cited

U.S. PATENT DOCUMENTS

| | | | |
|---|---|---|---|
| 6,191,494 B1 * | 2/2001 | Ooyama et al. | 257/796 |
| 7,232,755 B1 * | 6/2007 | McLellan et al. | 438/674 |
| 7,538,022 B2 * | 5/2009 | Kurita et al. | 438/614 |

* cited by examiner

*Primary Examiner* — Thiem Phan

(57) ABSTRACT

A method of manufacturing a printed circuit board having solder balls. The method may include: stacking a second carrier, in which at least one hole is formed, over one side of a first carrier; forming at least one solder bump by filling the hole with a conductive material; forming a circuit pattern layer, which is electrically connected with the solder bump, on the second carrier; and exposing the solder bump by removing the first carrier and the second carrier. Using this method, uniform hemispherical solder balls with fine pitch can be formed as a part of the manufacturing process, without having to attach the solder balls separately. Carriers may be used to serve as supports during the manufacturing process, whereby deformations can be prevented in the board.

11 Claims, 12 Drawing Sheets

METHOD OF MANUFACTURING PRINTED CIRCUIT BOARD

CROSS-REFERENCE TO RELATED APPLICATIONS

This application claims the benefit of Korean Patent Application No. 10-2007-0129894 filed with the Korean Intellectual Property Office on Dec. 13, 2007, the disclosure of which is incorporated herein by reference in its entirety.

BACKGROUND

1. Technical Field

The present invention relates to a method of manufacturing a printed circuit board.

2. Description of the Related Art

In accordance with the general trends towards decreasing sizes in electronic products equipped with semiconductor packages, such as communication equipment and computers, etc., there is active research under way on reducing the sizes of the semiconductor packages without diminishing their functionality. Such semiconductor packages may include several lands formed on one side, to which solder balls may be fused on, providing a function as terminals for signal input/output.

In particular, the ball grid array semiconductor device refers to an arrangement in which a chip is electrically connected with a next level package, such as a PCB, etc., by way of solder balls distributed over a two-dimensional plane in an array. Using the ball grid array, it is possible to implement a semiconductor device that provides high electrical performance as well as superb thermal properties.

With continuing increases in density, there is a greater demand for multi-stack structures, and with increases in the number of semiconductor chips mounted, so also is the number of I/O connection terminals increasing. Therefore, there is a growing need for fine-pitch bumps and uniform solder balls.

Also, in order to implement high-density, ultra-thin packages, the packages are being produced with lower thicknesses. This can increase the likelihood of bending in the package board, and can present difficulties in determining how the board is to be handled during the manufacturing process. As such, there is a need for a manufacturing method with which bending may be avoided.

SUMMARY

An aspect of the invention is to provide a method of manufacturing a printed circuit board, which enables the implementation of fine pitch and solder balls of uniform sizes, and which can also reduce deformations in cases where the manufactured board is so thin as to impose difficulties in handling.

Another aspect of the invention provides a method of manufacturing a printed circuit board that includes: stacking a second carrier, in which at least one hole is formed, over one side of a first carrier; forming at least one solder bump by filling the hole with a conductive material; forming a circuit pattern layer, which is electrically connected with the solder bump, on the second carrier; and exposing the solder bump by removing the first carrier and the second carrier.

Before the operation of stacking the second carrier, the method may further include stacking the first carrier over a metal layer, in which case the forming of the solder bump may include forming the solder bump by performing plating using the metal layer as a seed layer. The metal layer can be made from a metal such as nickel (Ni) or tin (Sn), etc., that allows selective etching to copper (Cu).

After the stacking of the second carrier, an operation may further be included of stacking a coating layer over the second carrier, where at least one opening may be formed in the coating layer that corresponds with the hole. The coating layer can be made of an organic material.

In certain embodiments, the method may additionally include an operation of performing copper plating over an exposed portion of the solder bump, after the operation of forming the solder bump. After the exposing of the solder bump, the solder bump may be reflowed to form a solder ball.

The first carrier may include stainless steel or an organic resin material, while the second carrier may be formed from a metallic material.

The forming of the circuit pattern layer can include forming an insulation layer over the second carrier and the solder bump; forming at least one via hole that exposes a solder bump by selectively etching the insulation layer; and forming a circuit pattern on the insulation layer that is electrically connected with the solder bump. Also, the method may include, after the forming of the via hole: forming a seed layer over a surface of the insulation layer and a wall surface of the via hole; and stacking a photoresist over the seed layer, the photoresist having portions removed where at least one via and the circuit pattern are to be formed. In this case, the forming of the circuit pattern can be achieved by electroplating.

This operation of forming the circuit pattern layer can be repeatedly performed to form a multi-layer printed circuit board.

Additional aspects and advantages of the present invention will be set forth in part in the description which follows, and in part will be obvious from the description, or may be learned by practice of the invention.

DETAILED DESCRIPTION

Figure 1:
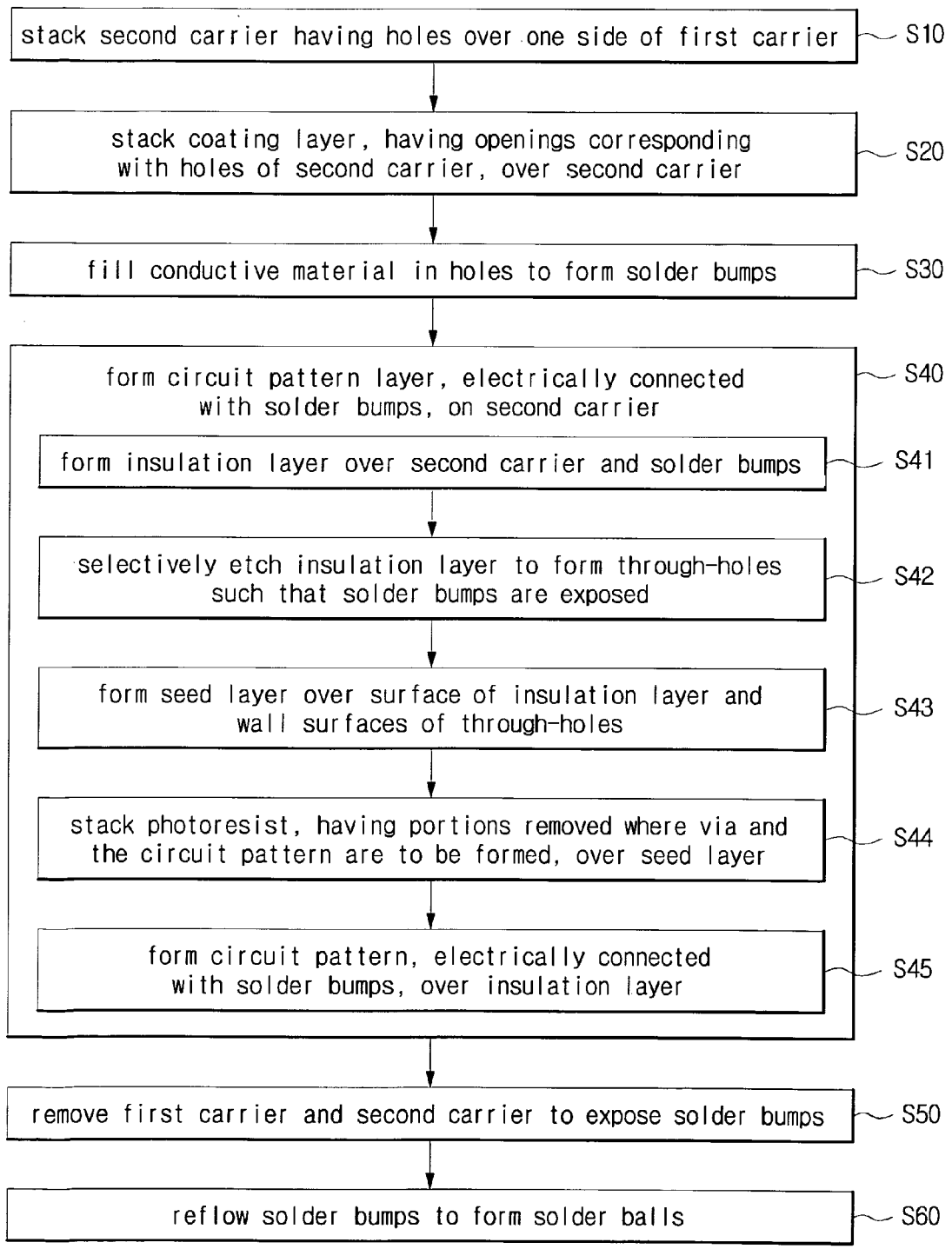
FIG. 1 is a flowchart illustrating a method of manufacturing a printed circuit board according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The method of manufacturing a printed circuit board according to certain embodiments of the invention will be described below in more detail with reference to the accompanying drawings. Those components that are the same or are in correspondence are rendered the same reference numeral regardless of the figure number, and redundant explanations are omitted.

FIG. 1 is a flowchart illustrating a method of manufacturing a printed circuit board according to an embodiment of the invention, and FIG. 2 through FIG. 12 are cross-sectional views representing the procedures in a method of manufacturing a printed circuit board according to an embodiment of the invention. In FIGS. 2 to 12, there are illustrated a first carrier 10, a metal layer 11, a second carrier 12, a coating layer 13, holes 14, solder bumps 15, insulation layers 16, via holes 17, seed layers 18, resists 19, circuit patterns 20, circuit pattern layers 21, an etching resist 22, and solder balls 23.

According to this embodiment, uniform hemispherical solder balls with fine pitch can be formed as a part of the manufacturing process, without having to attach the solder balls separately. Carriers may be used to serve as supports during the manufacturing process, whereby deformations can be prevented in the board.

First, a second carrier 12 in which holes 14 are formed may be stacked over one side of a first carrier 10 (S10).

The first carrier 10 can be a member that serves as a support during the stacking of the board. The carrier can be made, for example, from stainless steel or organic resin. Using stainless steel for the carrier can provide the advantage of easier separation from the board in a subsequent process for separating the first carrier.

The second carrier 12 can be a member that serves as a cast, and can have holes 14 formed in positions corresponding to where solder bumps 15 are to be formed. In the latter part of the manufacturing process, the second carrier 12 can be removed, to expose the solder bumps 15 on the surface. A metallic material can be used for the second carrier 12. Because a metallic material can be resistant to both heat and mechanical force, the second carrier 12 may not be deformed by heat or pressure applied during the manufacturing process, and thus the solder bumps 15 may be formed in the precise locations in the desired shapes. In certain examples, the second carrier 12 can be made from copper.

Before stacking the second carrier 12 over the first carrier 10, a metal layer 11 may be formed over one side of the first carrier 10. The metal layer 11 may serve as a seed layer 18 to allow the forming of the second carrier 12 and solder bumps 15 by plating, and may also serve as a boundary that allows easy separation of the first carrier 10.

An example of a method for forming the metal layer 11 includes electroforming. Electroforming may include electrodepositing a metal onto a base form coated with a stripping film, and afterwards, either separating the electrodeposited metal, to obtain a product having an inversed surface compared to that of the base form, or applying a stripping film treatment again to the surface of the electrodeposited metal, electrodepositing a metal, and separating, to obtain a product having an identical surface to that of the base form.

A metal or alloy that can be electroplated can generally be used in electroforming. In certain embodiments of the invention, nickel (Ni) can be used, which may readily be separated from a first carrier 10 made of stainless steel.

Figure 2:
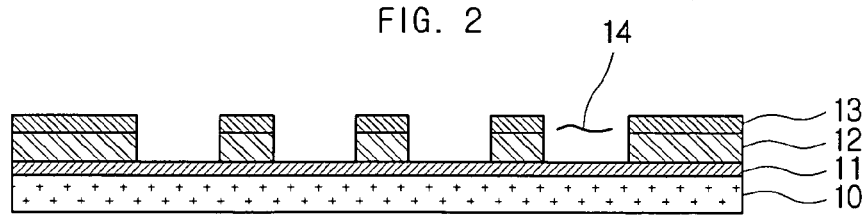
FIG. 2, FIG. 3, FIG. 4, FIG. 5, FIG. 6, FIG. 7, FIG. 8, FIG. 9, FIG. 10, FIG. 11, and FIG. 12 are cross-sectional views representing the procedures in a method of manufacturing a printed circuit board according to an embodiment of the invention.
Figure 3:
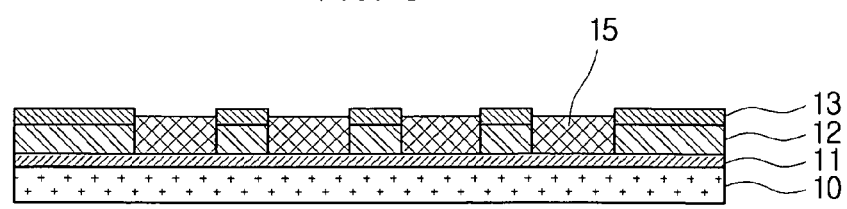
Figure 4:
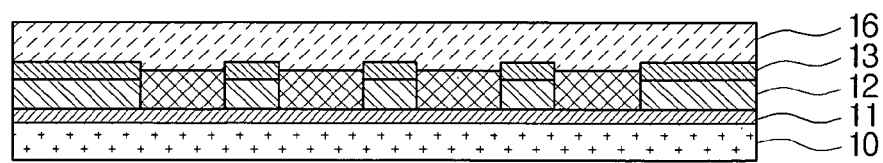

Next, a coating layer 13 in which holes 14 are formed may be stacked over the surface of the second carrier 12 (S20). FIG. 2 illustrates an example in which the metal layer 11, second carrier 12, and coating layer 13 are stacked over the first carrier 10. The coating layer 13 may serve to control the positions of the solder bumps 15 such that the solder bumps 15 are filled only in the holes 14 formed in the second carrier 12 and not formed anywhere else. The coating layer 13 may serve as a plating resist when forming the solder bumps 15, and may serve also as a solder resist when it is uncovered after the removal of the carriers. As such, there is no need to apply a separate solder resist, and the number of processes may be reduced.

The coating layer 13 may serve as a plating resist during the forming of the solder bumps 15, and thus an insulating material may be used for the coating layer 13. An example of such material can include polyimide (PI). Polyimide refers to any polymer having imide bonds in the main chain. Plastic type polyimides provide many advantages and thus are commonly used as engineering plastic materials. Examples of these advantages include high mechanical strength, high resistance to impacts, and high dimensional stability. Furthermore, the plastic type polyimides may provide electrically insulating properties, flame retarding properties, high endurance, and resistance to chemicals. As such, the polyimides may undergo little or no deformation in spite of the heat applied during processes for manufacturing the board, and may withstand the etchant used in removing the carriers.

Next, the solder bumps 15 may be formed inside the holes 14 (S30). Since the solder bumps 15 will be used in the semiconductor package to connect to a semiconductor chip, a conductive material can be used for the solder bumps 15. A typical example may include a tin (Sn) and lead (Pb) alloy having a fusing point of 450° C. or lower. Different compositions may provide variations in the fusing point, as well as in the mechanical properties (rigidity, strength), electrical properties (conductivity, thermoelectromotive forces), chemical properties (corrosion properties, migration), and physical properties (density, thermal expansion).

The solder bumps 15 can be formed by filling the holes 14 in the second carrier 12 with solder paste. Since a metal layer 11 is available, it is also possible to form the solder bumps 15 using an electroplating method, to obtain the solder bumps 15 with greater precision. As in the example illustrated in FIG. 3, the solder bumps 15 may be filled only in the holes 14, because of the coating layer 13.

After the solder bumps 15 are formed, exposed portions of the solder bumps 15 may be plated with copper. While the copper plating is not absolutely necessary, it can increase reliability in connecting to a circuit pattern 20, and can provide lands on which solder balls 23 may be formed, during the process for forming the solder balls 23 by reflowing, so that the solder balls 23 may be liquefied in the precise positions.

Next, a circuit pattern layer 21 electrically connected with the solder bumps 15 may be formed over the second carrier 12 (S40). The circuit pattern layer 21 can be a layer that includes an insulation layer 16 and a circuit pattern 20. By using multiple circuit pattern layers 21 that are electrically interconnected, it is possible to manufacture a multi-layer printed circuit board.

A method of forming the circuit pattern layer 21 may include, first, forming an insulation layer 16 over the second carrier 12 and solder bumps 15 (S41). As in the example illustrated in FIG. 4, the insulation layer 16 may be stacked such that the second carrier 12 and solder bumps 15 are covered.

Figure 5:
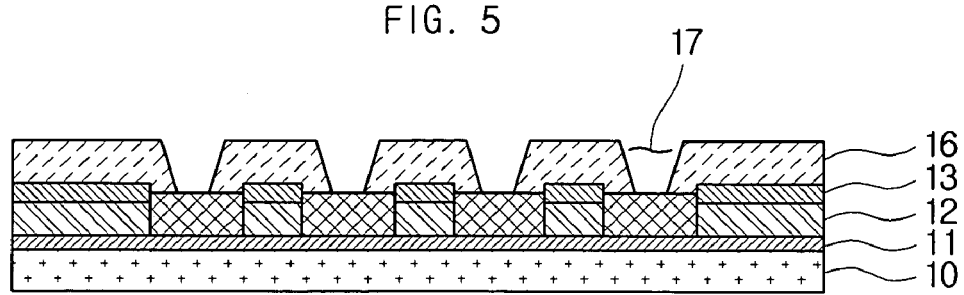

Then, as in the example illustrated in FIG. 5, the insulation layer 16 can be selectively etched to form via holes 17, such that the solder bumps 15 are exposed (S42). The via holes 17 can be filled in with a conductive material to electrically connect the solder bumps 15 with the circuit pattern 20. Thus, the via holes 17 can be formed in positions corresponding with the solder bumps 15.

Figure 6:
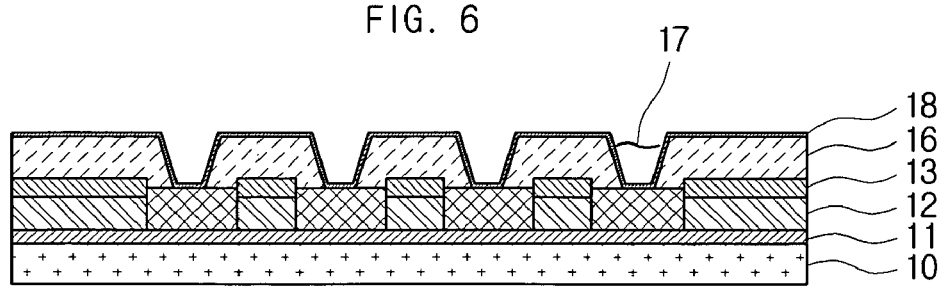
Figure 7:
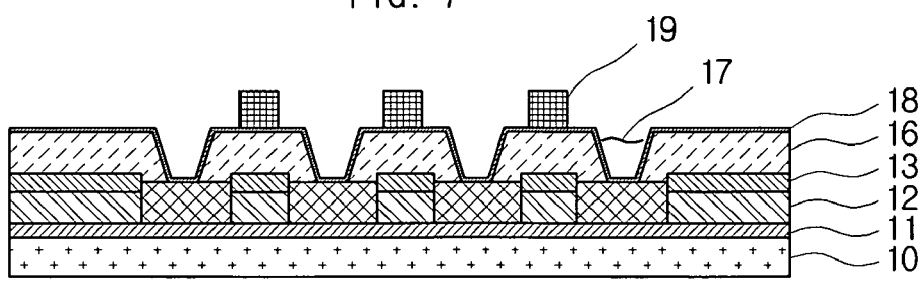
Figure 8:
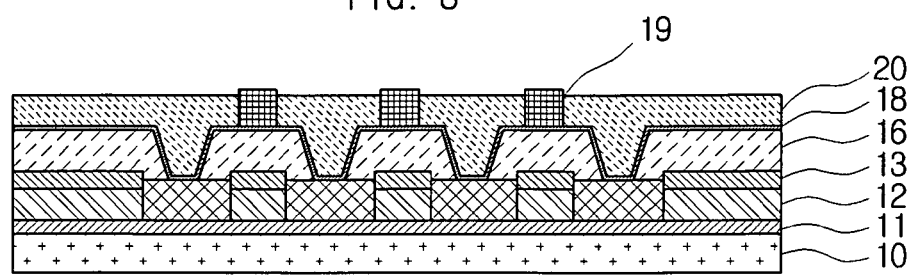
Figure 9:
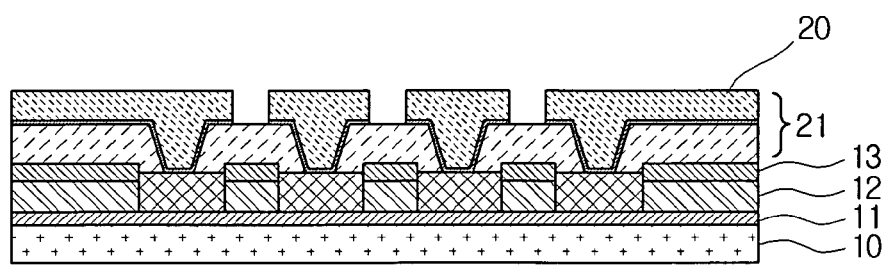
Figure 10:
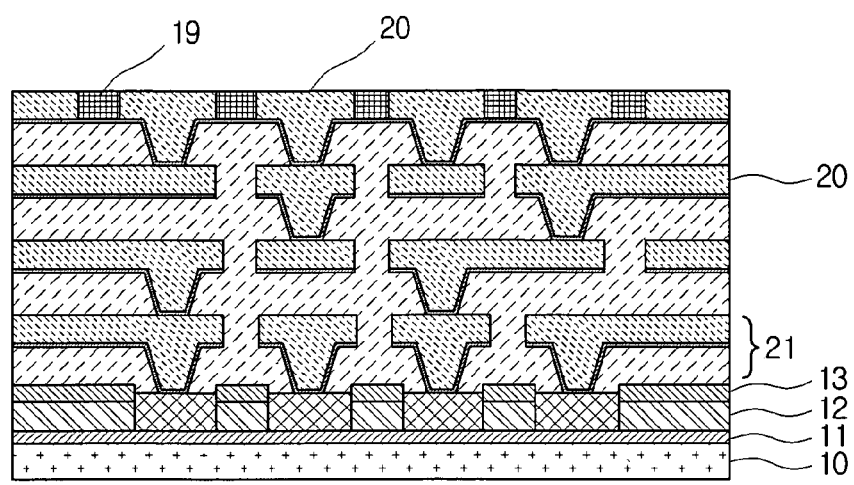

Next, a seed layer 18 may be formed over the surface of the insulation layer 16 and the wall surfaces of the via holes 17 (S43), and a photoresist 19 having portions removed where the circuit pattern 20 and vias will be formed may be stacked over the seed layer 18 (S44). Examples of these processes are illustrated in FIG. 6 and FIG. 7.

Next, electroplating may be performed, using the seed layer 18 as an electrode, to form a circuit pattern 20 electrically connected with the solder bumps 15 over the insulation layer 16 (S45). That is, the via holes 17 may be filled to form the circuit pattern 20 connected with the solder bumps 15, as in the example illustrated in FIG. 8, after which the photoresist 19 may be removed and the exposed seed layer 18 may be removed, so that portions other than the circuit pattern 20 may not be electrically connected.

In this way, the circuit pattern layer 21 may be formed. In the description for this embodiment, the forming of the circuit pattern 20 has been presented using an additive method as an example. The procedures for forming the circuit pattern layer 21 can be repeated twice or more, to form a multi-layer printed circuit board, such as that illustrated in FIG. 10.

Figure 11:
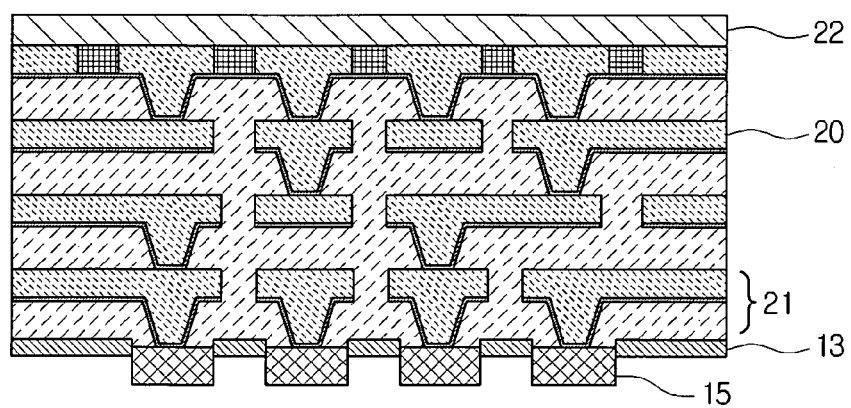

As in the example illustrated, in FIG. 11, the first carrier 10 and the second carrier 12 may be removed to expose the solder bumps 15 (S50). If stainless steel is used for the first carrier 10 and a metal layer 11 made of nickel is interposed between the first carrier 10 and the second carrier 12, the first carrier 10 may readily be separated from the metal layer 11.

The metal layer 11 can be removed using an etchant, and if the second carrier 12 is also made from a metallic material, the etchant may also be applied to the second carrier 12. Here, portions of the carrier 12 can be left in the edge portions of the board, to serve as a support for the board. With the second carrier 12 removed, the coating layer 13 and the solder bumps 15 may be uncovered, where the coating layer 13 may serve as a solder resist, as already described above.

Figure 12:
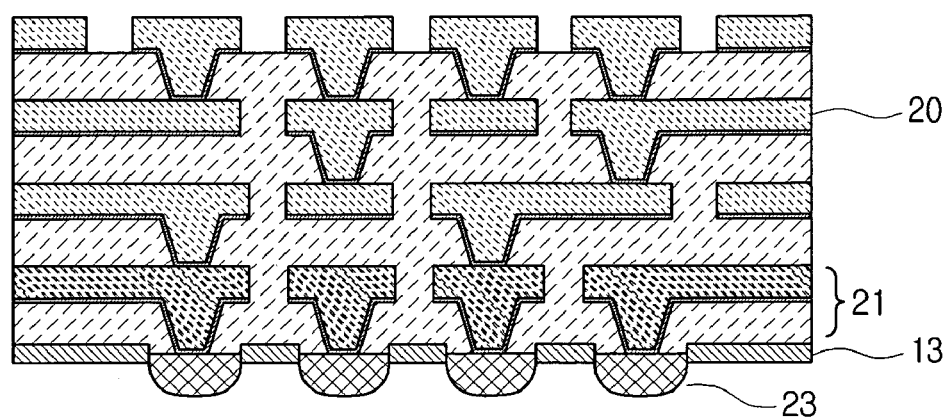

Next, as in the example illustrated in FIG. 12, reflowing may be performed to form solder balls 23 (S60). Reflowing refers to heating and melting the solder bumps 15 in order to form solder balls 23 liquefied in hemispherical shapes.

According to certain embodiments of the invention as set forth above, uniform hemispherical solder balls with fine pitch can be formed as a part of the manufacturing process, without having to attach the solder balls separately. Carriers may be used to serve as supports during the manufacturing process, whereby deformations can be prevented in the board. In particular, if a coating layer is formed, the coating layer can serve both as a plating resist when forming the solder bumps, and as a solder resist after the carriers are removed. This can lead to savings in terms of the amount of materials used, as well as to reductions in the number of processes.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board comprising:
   stacking a second carrier over one side of a first carrier, the second carrier having at least one hole formed therein;
   stacking a coating layer over the second carrier, the coating layer having at least one opening formed therein in correspondence with the hole;
   forming at least one solder bump by filling the hole with a conductive material;
   forming a circuit pattern layer on the coating layer, the circuit pattern layer electrically connected with the solder bump; and
   removing the first carrier and the second carrier so that the solder bump and the coating layer are exposed.

2. The method of claim 1, further comprising, before the stacking of the second carrier:
   stacking the first carrier over a metal layer,
   wherein the forming of the solder bump comprises:
   forming the solder bump by performing plating with the metal layer as a seed layer.

3. The method of claim 2, wherein the metal layer is made from a metal selectively etchable to copper (Cu).

4. The method of claim 1, wherein the coating layer is made of an organic material.

5. The method of claim 1, further comprising, after the forming of the solder bump:
   performing copper plating over an exposed portion of the solder bump.

6. The method of claim 1, further comprising, after the exposing of the solder bump:
   forming at least one solder ball by reflowing the solder bump.

7. The method of claim 1, wherein the first carrier includes stainless steel or an organic resin material.

8. The method of claim 1, wherein the second carrier includes a metallic material.

9. The method of claim 1, wherein the forming of the circuit pattern layer comprises:
   forming an insulation layer over the coating layer and the solder bump;
   forming at least one via hole by selectively etching the insulation layer, the via hole exposing the solder bump; and
   forming a circuit pattern on the insulation layer, the circuit pattern electrically connected with the solder bump.

10. The method of claim 9, further comprising, after the forming of the via hole:
    forming a seed layer over a surface of the insulation layer and a wall surface of the via hole; and
    stacking a photoresist over the seed layer, the photoresist having portions removed where at least one via and the circuit pattern are to be formed,
    wherein the forming of the circuit pattern is performed by electroplating.

11. The method of claim 1, wherein the forming of the circuit pattern layer is repeated such that a multi-layer printed circuit board is formed.

* * * * *